US006794798B2

(12) United States Patent
Watanabe et al.

(10) Patent No.: US 6,794,798 B2
(45) Date of Patent: Sep. 21, 2004

(54) DISPLAY DEVICE AND ELECTRONIC EQUIPMENT EMPLOYING PIEZOELECTRIC SPEAKER

(75) Inventors: Yoshiyuki Watanabe, Tokyo (JP); Shigeo Ishii, Tokyo (JP); Hisayoshi Matsui, Tokyo (JP); Hiroshi Kishi, Tokyo (JP)

(73) Assignee: Taiyo Yuden Co., Ltd., Tokyo (JP)

(*) Notice: Subject to any disclaimer, the term of this patent is extended or adjusted under 35 U.S.C. 154(b) by 266 days.

(21) Appl. No.: 10/106,118

(22) Filed: Mar. 27, 2002

(65) Prior Publication Data

US 2002/0141164 A1 Oct. 3, 2002

(30) Foreign Application Priority Data

Mar. 30, 2001 (JP) ....................................... 2001-101504

(51) Int. Cl.[7] ................................................ H01L 41/08

(52) U.S. Cl. ....................................... 310/334; 361/683

(58) Field of Search ................................ 310/330–332, 310/334, 324, 322; 361/381–383

(56) References Cited

U.S. PATENT DOCUMENTS

| | | | | |
|---|---|---|---|---|
| 5,825,614 | A | * 10/1998 | Kim | 361/683 |
| 6,128,186 | A | * 10/2000 | Feierbach | 361/683 |
| 6,169,582 | B1 | * 1/2001 | Lee | 348/552 |
| 6,325,346 | B1 | * 12/2001 | Chang et al. | 248/225.11 |
| 6,487,068 | B1 | * 11/2002 | Rahemtulla | 361/681 |
| 6,643,124 | B1 | * 11/2003 | Wilk | 361/681 |
| 6,667,759 | B2 | * 12/2003 | Gerszberg et al. | 348/14.01 |

* cited by examiner

*Primary Examiner*—Mark Budd
(74) *Attorney, Agent, or Firm*—Bacon & Thomas, PLLC

(57) ABSTRACT

A display device and an electronic equipment having a high reproduction quality can be provided without hampering the scalability or the portability of the display device and the electronic equipment. A notebook computer includes a main body, a keyboard, a display device and a display panel. The display panel is formed of a flat type, which is made of an LCD or a PDP. The display device can be folded toward or folded away from the keyboard side of the main body. The speaker panel is completely formed as a planar shape and is movably installed with respect to a reception slit prepared at two side surfaces of the display device. The speaker panel is movably jointed to allow a relative position between the flat panel display and the speaker panel to be changed by moving the speaker panel.

10 Claims, 16 Drawing Sheets

DISPLAY DEVICE AND ELECTRONIC EQUIPMENT EMPLOYING PIEZOELECTRIC SPEAKER

FIELD OF THE INVENTION

The present invention relates to a display device and an electronic equipment using same; and, more particularly, to an improved installation method of a speaker of a display device.

DESCRIPTION OF THE PRIOR ART

Flat panel displays, e.g., a liquid crystal display (LCD), a plasma display panel (PDP) and the like do not require a large installation space since they are much thinner than a cathode ray tube (CRT) display. Accordingly, they are employed in various electronic equipments such as personal computers, televisions, digital video disc (DVD) players. Main bodies of the electronic equipments also become compact-sized for the portability thereof. Also, with the recent proliferation of multimedia equipments, there is growing demand for high quality sound. Speakers for such multimedia equipment are frequently mounted on display devices thereof. There are two types of such built-in type speaker systems; one with small speakers mounted on the outside portion of an electronic equipment at the left and the right side thereof for example, and the other type with small speakers installed inside an electronic equipment.

However, these conventional speaker installation methods have certain problems as follows:

(1) The externally mounted speakers lose much of the space-saving advantage achieved by a main body of the electronic equipment thin. Especially, the portability of notebook computer, for example, can be deteriorated or lost considerably.

(2) In case where speakers 310 are embedded in a main body 302 of a notebook computer 300, e.g., as shown in FIG. 13, a large space may not be reserved for speaker installation due to the compact arrangement of components in the main body 302. Thus, the relatively small-sized speakers 310 may have to be mounted in the main body 302. However, it is difficult to obtain a high sound reproduction quality across a wide frequency band from a small speaker. On the other hand, securing a large speaker installation space would increase the size of the notebook computer 300 itself, hampering the portability thereof.

SUMMARY OF THE INVENTION

It is, therefore, an object of the present invention to provide a display device and an electronic equipment capable of providing a high quality reproduced sound without increasing the size and hampering the portability of the display device and the electronic equipment.

In accordance with a preferred embodiment of the present invention, there is provided an electronic equipment comprising: a flat panel display; and a speaker panel movably jointed to the flat panel display to allow a relative position between the flat panel display and the speaker panel to be changed by moving the speaker panel.

In accordance with another preferred embodiment of the present invention, there is provided an electronic equipment comprising: a flat panel display; and a speaker panel, the flat panel display and the speaker panel being provided in a housing, wherein the flat panel display is located in a front side of the housing and the speaker panel is positioned behind the flat panel display, and wherein sound transmitting holes are provided at least at the left and the right side of the front side of the housing.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Preferred embodiments will now be described in detail with reference to the accompanying drawings. Like numerals represent the same or corresponding parts in the various drawings.

(First Embodiment)

Figure 1:
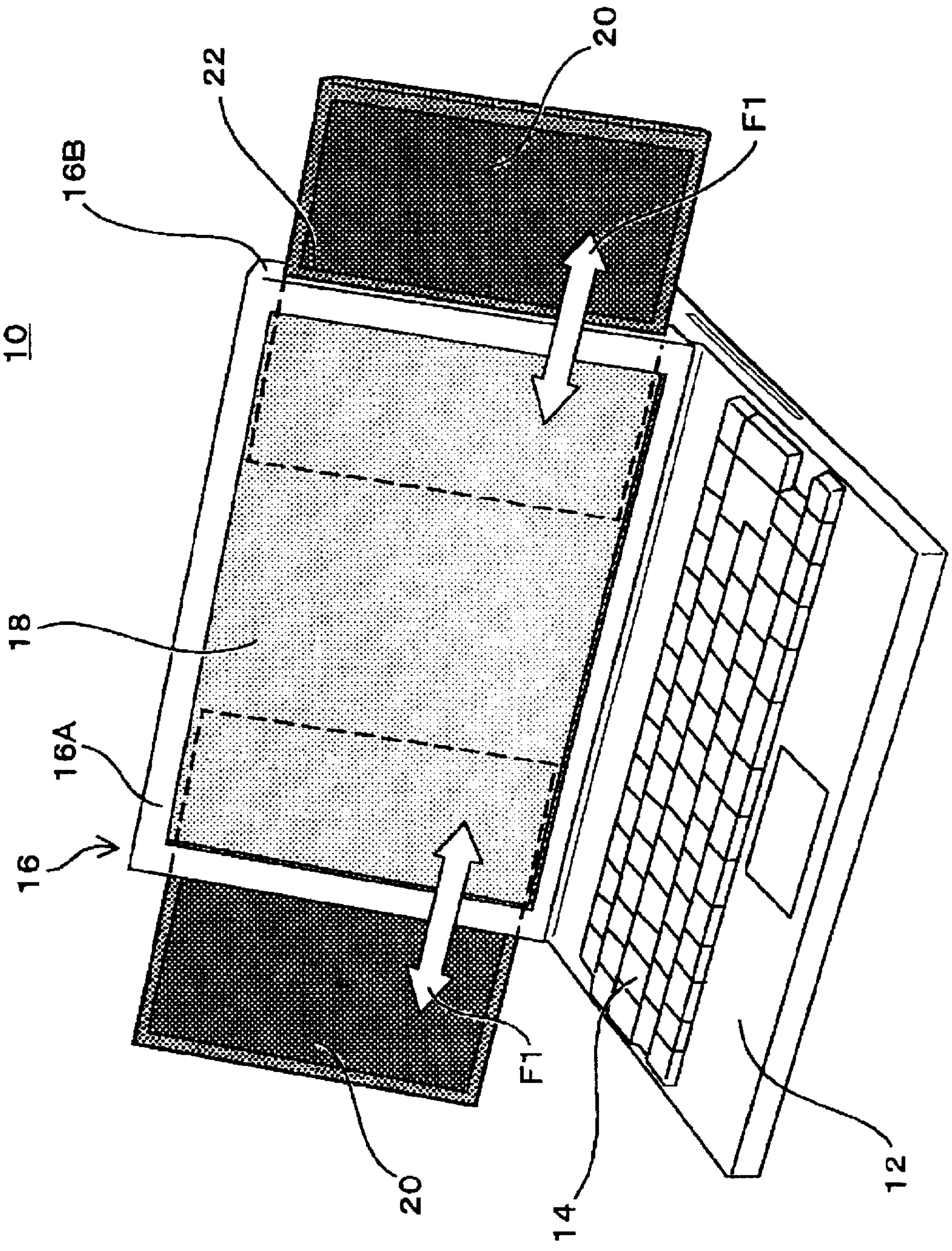
FIG. 1 shows a front perspective view of a first preferred embodiment of the present invention.

Referring to FIG. 1, there is provided a perspective view of a notebook computer 10 in accordance with a first preferred embodiment of the present invention.

The notebook computer 10 has a main body 12, a keyboard 14 installed on the main body and a display device 16. The main body 12 has a CPU (central processing unit), a memory, an HDD (hard disk drive), an FDD (floppy disk drive), etc., while the display device 16 has a display panel 18 formed by using, e.g., an LCD (liquid crystal display) or a PDP (plasma display panel) in such a manner so as to have a thin and planar shape. The display device 16 can be rotatably folded toward or folded away from the keyboard side of the main body 12.

In this preferred embodiment, two speaker panels 20 are installed moveably along translational direction at two opposite sides of the display panel 18. That is, prepared at the two side surfaces of the display panel 18 are reception slits 22 through which the speaker panels 20 slide into and out of the display device 16. The speaker panels 20 have a planar shape and a size suitable for being fully accommodated in the display device 16 when they are put thereinto together. To be specific, the speaker panels 20 slide into or out of the display device through the reception slits 22 along the direction marked with arrows F1 as shown in FIG. 1. At least one speaker is mounted on each speaker panel 20. Two or three speakers for the sound reproduction at different frequency bands can also be prepared for each speaker panel 20 instead. The speaker can be of a piezoelectric type or a dynamic type speaker, though the piezoelectric type speaker is more preferable due to its more scaled-down thickness.

When carrying the notebook computer 10 or the sound reproduction is not necessary, the speaker panels 20 are accommodated in the display device 16 by sliding them therein. When the sound reproduction is needed, however, the speaker panels 20 are taken out of the display device 16 through the reception slits 22. It is also possible to install the speaker panels 20 to move slidably on the rear side of the display device 16.

As described above, the planar type speaker panels 20 are slidably installed at the two side surfaces of the display device 16 or on the back side thereof in accordance with the first preferred embodiment of the present invention. Accordingly, the size of the speaker can become larger than that of conventional built-in type speaker, thereby allowing the sound reproduction quality to be greatly improved. Further, since the speaker panels 20 are accommodated within or at the back of the display device 16 when they are not used, the notebook computer 10 can be used without being impeded by the presence of the speaker panels 20 while preserving the scalability and the portability of the notebook computer 10.

(Second Embodiment)

Figure 2:
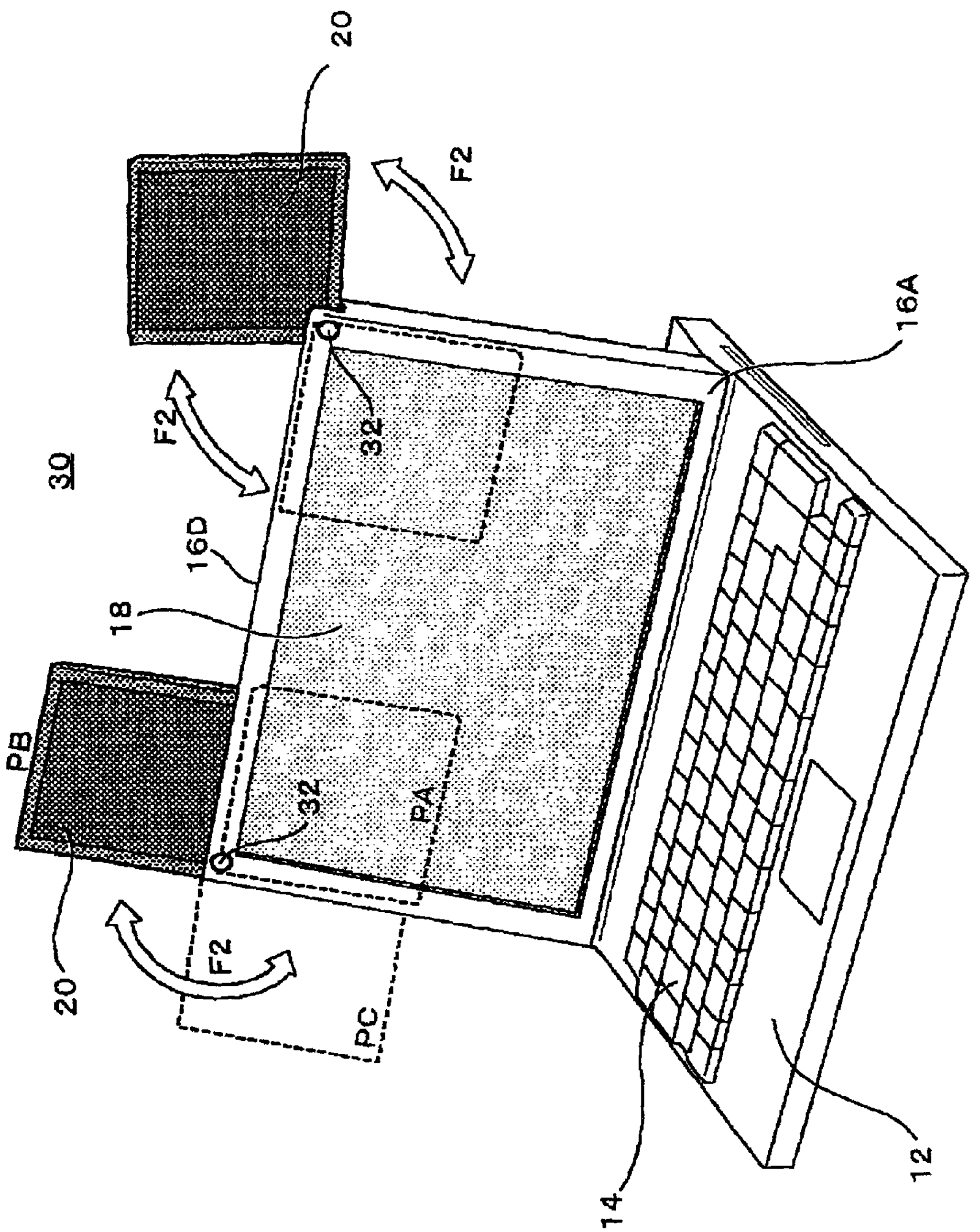
FIG. 2 presents a front perspective view of a second preferred embodiment of the present invention.

Referring to FIG. 2, there is provided a notebook computer 30 in accordance with a second preferred embodiment of the present invention. Unlike in the first embodiment where the speaker panels 20 are slidably formed at two opposite side surfaces 16B of the display device 16, speaker panels 20 in this second embodiment are pivotedly installed at two opposite upper corners of a display device 16. In other words, each speaker panel 20 is installed such that each speaker panel 20 can be taken out for use through a top surface 16D by the pivotal motion as shown by an arrow F2 about a pivot 32 prepared at an upper corner, from a storage position PA to a use position PC via an intermediate position PB.

(Third Embodiment)

Figure 3:
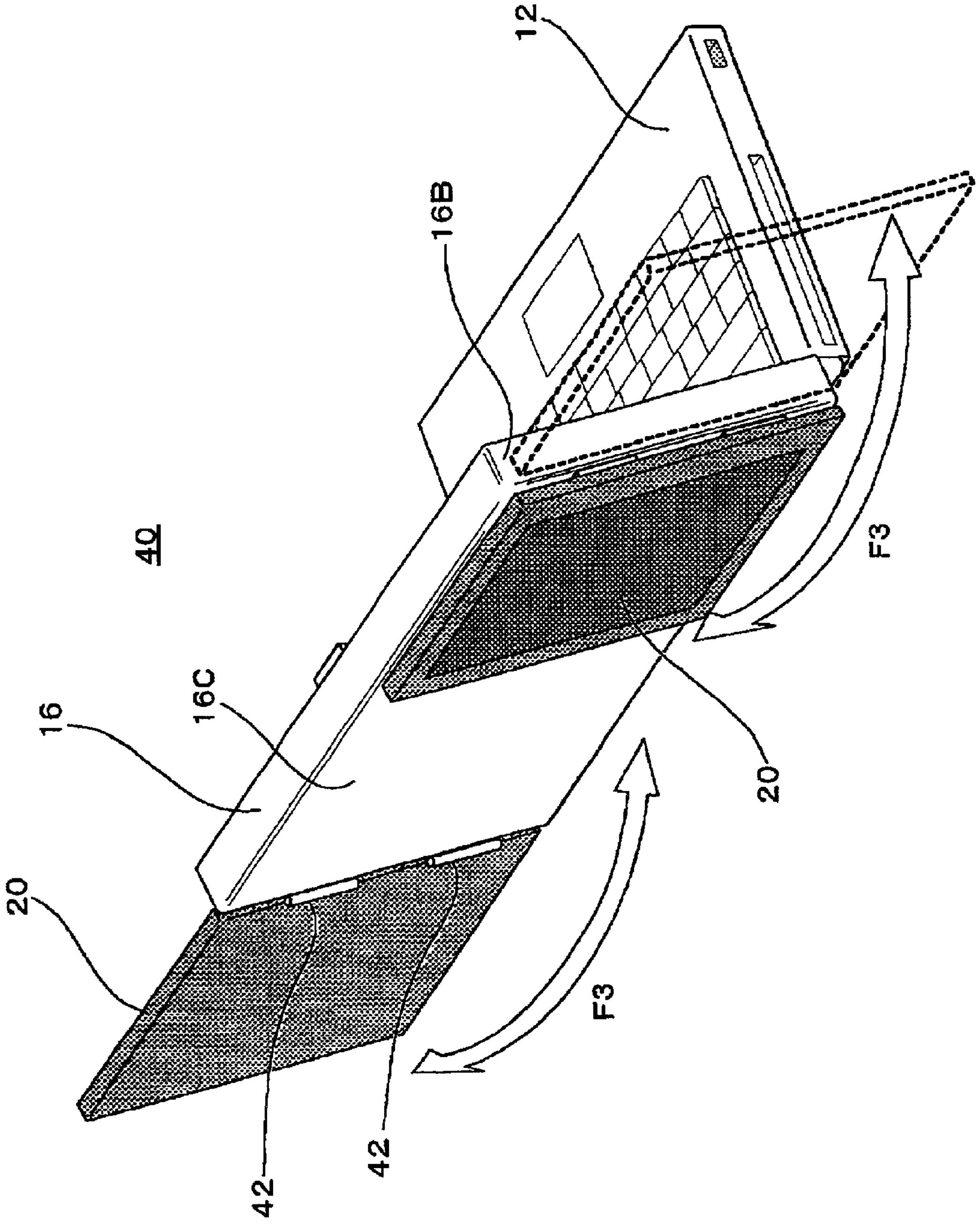
FIG. 3 depicts a rear perspective view of a third preferred embodiment of the present invention.

Referring to FIG. 3, there is provided a notebook computer 40 in accordance with a third embodiment of the present invention. Unlike in the above-described first and second preferred embodiment where speaker panels 20 are accommodated inside or rear side of a display device 16 and taken out through the side or a top surface 16B or 16D thereof, respectively, the speaker panels 20 in the third embodiment is rotatably installed at side surfaces 16B of the display device 16 by using connection hinges 42. When the speaker panels 20 are not used, they are folded onto a rear surface 16C of the display device 16. On the other hand, while it is being used, it is opened to thereby face the front same as a front surface 16A thereof, as illustrated by arrows F3.

Though the speaker panels 20 of the present embodiment have been described as being folded onto the rear surface 16C of the display device 16 when not used, it is also possible to configure the speaker panels 20 to be folded onto the front surface 16A of the display device when not used, to thereby cover and protect a display panel 18.

(Fourth Embodiment)

Figure 4A:
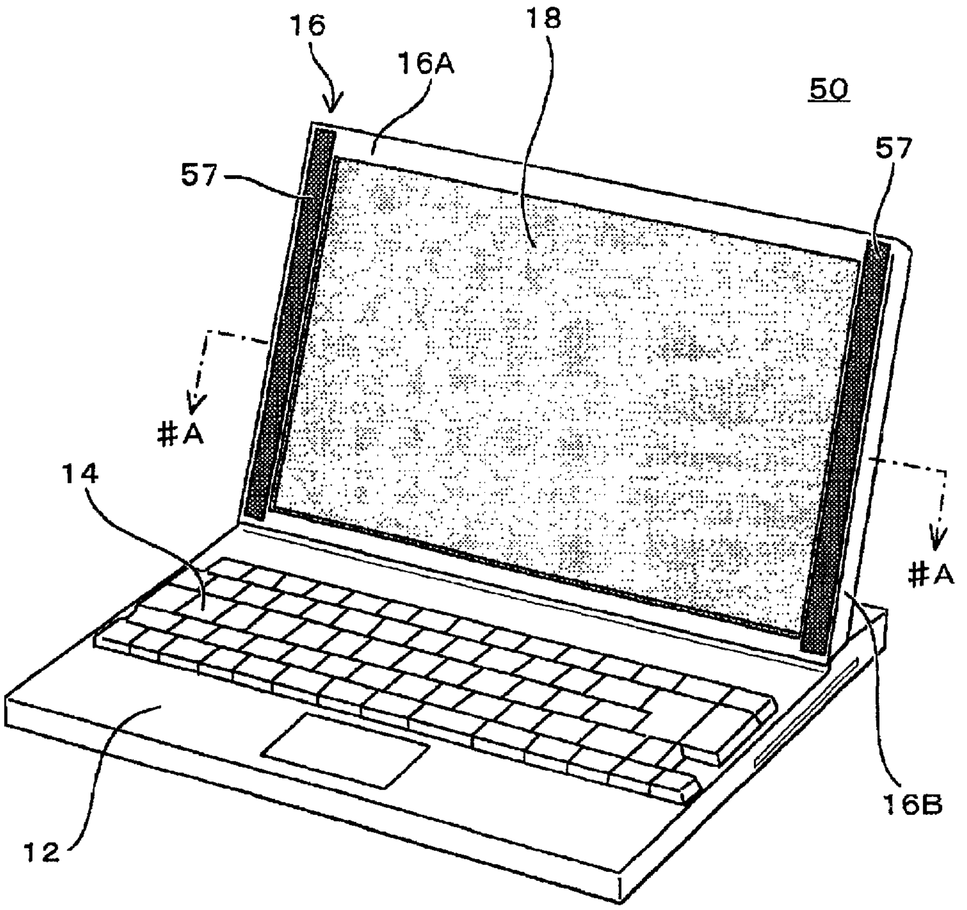
FIG. 4A illustrates a front perspective view of a fourth preferred embodiment of the present invention.
Figure 4B:
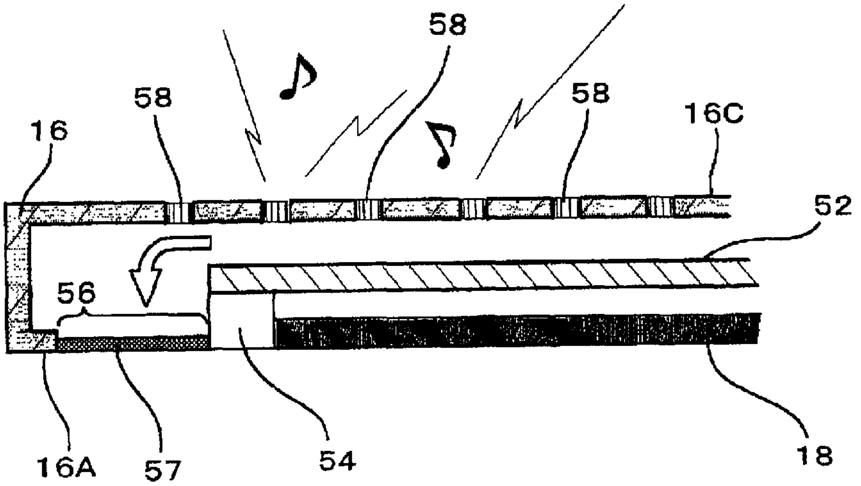
FIG. 4B is an enlarged partial cross sectional view taken along the line A—A shown in FIG. 4A.

Referring to FIG. 4A, there is provided a perspective view of a notebook computer 50 in accordance with a fourth embodiment of the present invention. FIG. 4B illustrates a partial cross sectional view of the notebook computer 50 taken along the line A—A of FIG. 4A. In the previous preferred embodiments, the speaker panels 20 are permanently accommodated within the display device 16 without being taken out therefrom even while being used.

The notebook computer 50 includes a main body 12, a keyboard 14 and a display device 16, as in the notebook computer 10 shown in FIG. 1. Speaker panels 52 are installed behind a display panel 18 by using supporters 54 of which only one is shown for the sake of simplicity. The speaker panels 52 are of a planar type, as in previous preferred embodiments described above.

Openings 56 are prepared at two opposite edges on a front surface 16A of the display device 16 so that sounds produced by the speaker panels 52 can propagate toward the front side of the notebook computer 50. Each of the openings 56 is covered with a cover 57 having plural holes. A plurality of sound transmitting holes 58 are prepared at a rear surface 16C of the display device 16 at a predetermined interval. The sound transmitting holes can also be prepared at a side surface 16B and/or a top surface 16D of the display device 16.

The sounds produced by the speaker panel 52 are outputted toward the front and the back side of the notebook computer 50 through the openings 56 and the sound transmitting holes 58. Since a speaker unit having, e.g., one or two speaker panels with a roughly the same size as that of the display panel 18 can be provided within the display device 16, the sound quality can be greatly improved, without increasing the size of the notebook computer 50 or sacrificing the portability thereof.

(Fifth Embodiment)

Figure 5:
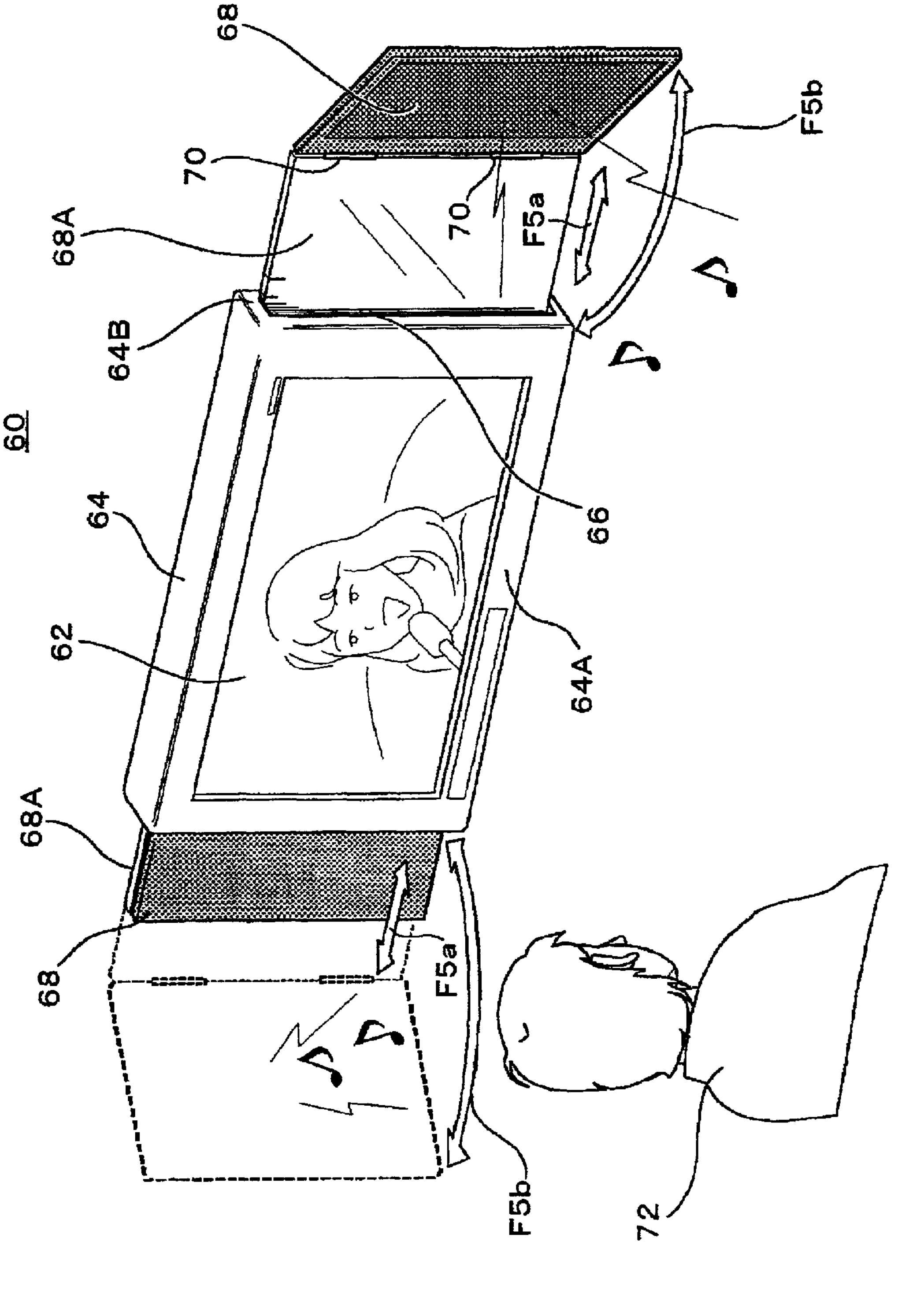
FIG. 5 offers a perspective view of a fifth preferred embodiment of the present invention.

Referring to FIG. 5, there is provided a television set 60 in accordance with a fifth embodiment of the present invention.

The television set 60 has a thin planar shape and includes a display device 64 having a display panel 62 prepared at a front surface 64A thereof. The display panel 62 is of the type of a flat panel display, e.g., an LCD or a PDP. Further, speaker panels 68 are slidably installed at reception slits 66 formed at side surfaces 64B of the display device 64. The speaker panels 68 slide into or out of the display device 64 through reception slits 66 prepared at the side surfaces 64B of the display device 64 along a direction of arrows F5*a*.

Each speaker panel 68 is connected to a connection part 68A by a connection hinge 70. While being used, the speaker panels 68 are slidably taken out from the display device 64 with the connection part 68A along the direction marked with the arrows F5*a* and then are rotatably opened about the connection hinge 70 along a direction of arrows F5*b*. The speaker panels 68 can be properly adjusted in their angles with respect to the display panel 62. Accordingly, a viewer 72 can adjust the auditory position of each speaker panel 68 to have an optimum angle. It is also preferable to install additional speakers on the connection parts 68A, thereby obtaining a further improved sound quality.

(Sixth Embodiment)

Figure 6:
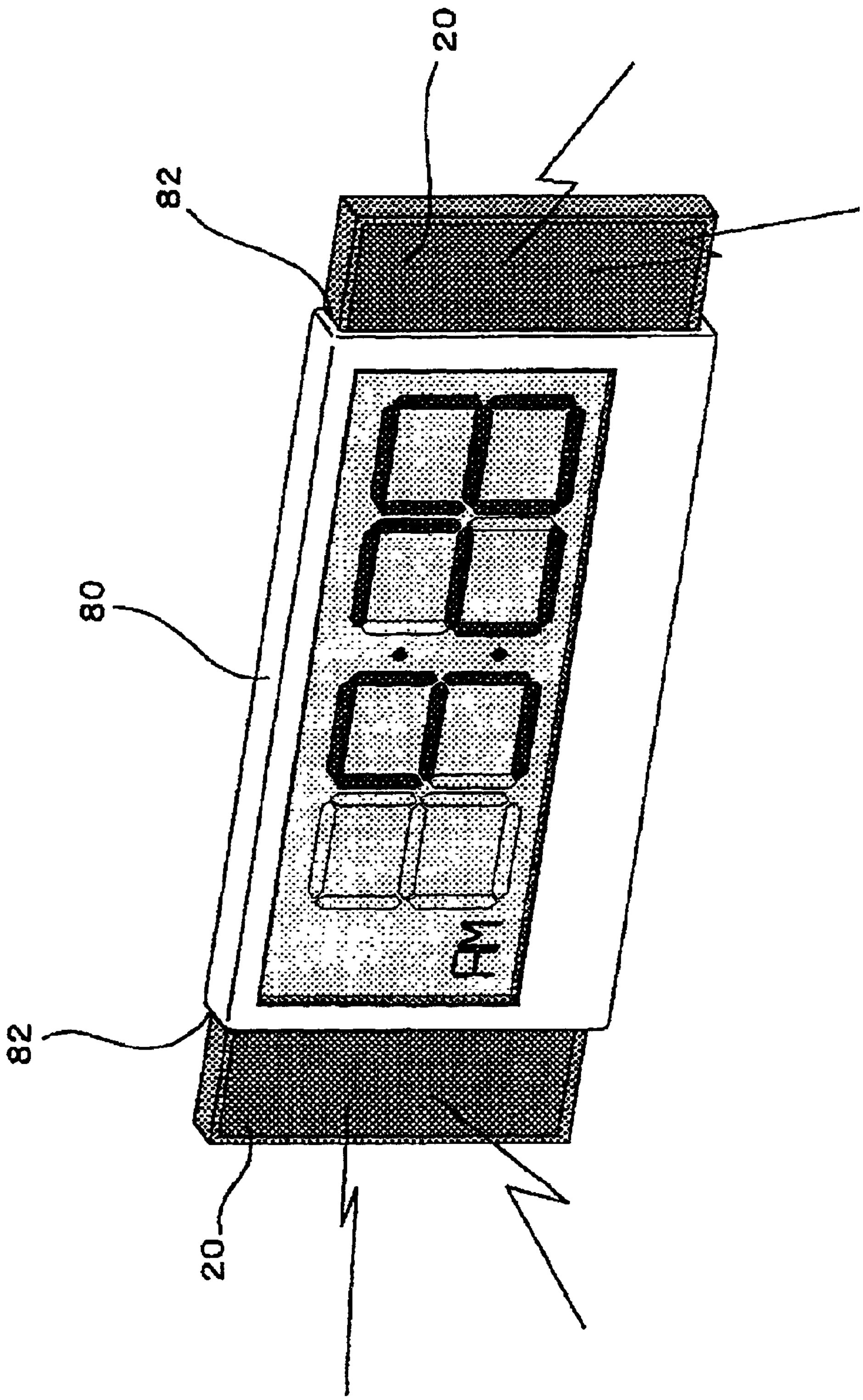
FIG. 6 provides a perspective view of a sixth preferred embodiment of the present invention.

Referring to FIG. 6, there is provided an LCD panel clock 80 in accordance with a sixth embodiment of the present invention. Speaker panels 20 are configured to slide into or out of the LCD panel clock 80 through sleeves 82 prepared at two opposing side surfaces thereof. The speaker panels 20 may be installed at the liquid panel crystal clock 80 as in the second or the third embodiments described in FIG. 2 or 3.

Current time information or alarming sound can be generated from the speaker panels 20. Further, if the LCD panel clock 80 is of a clock radio type having an embedded radio function therein, a radio broadcasting can also be outputted from the speaker panels 20. The LCD panel clock 80 can be of either a desk-top computer or a wall mounting type. Further, a remote controller can be employed to move the speaker panels 20 into or out of the LCD panel clock 80.

(Seventh Embodiment)

Figure 7:
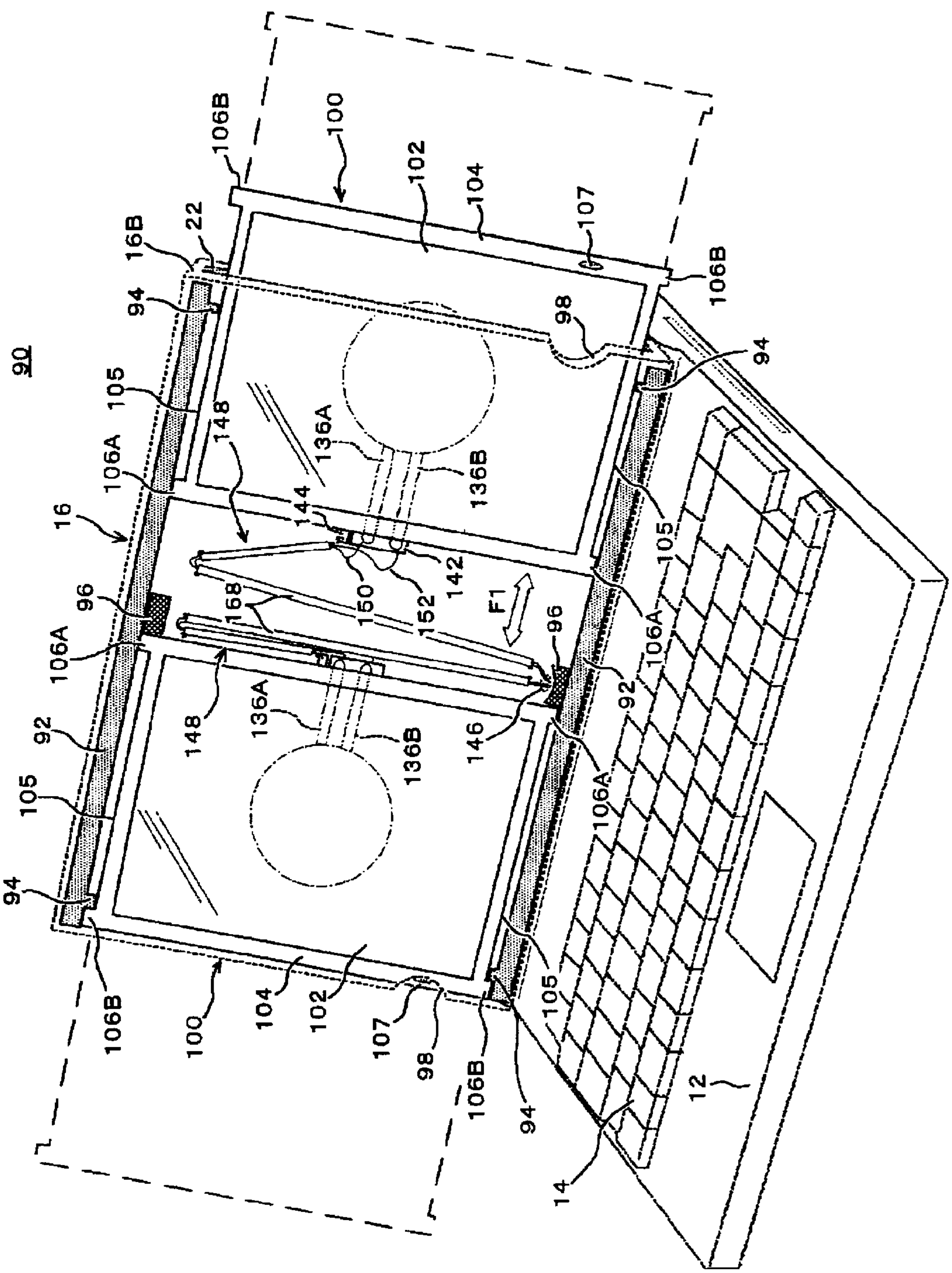
FIG. 7 represents a perspective view of a seventh preferred embodiment of the present invention.
Figure 8A:
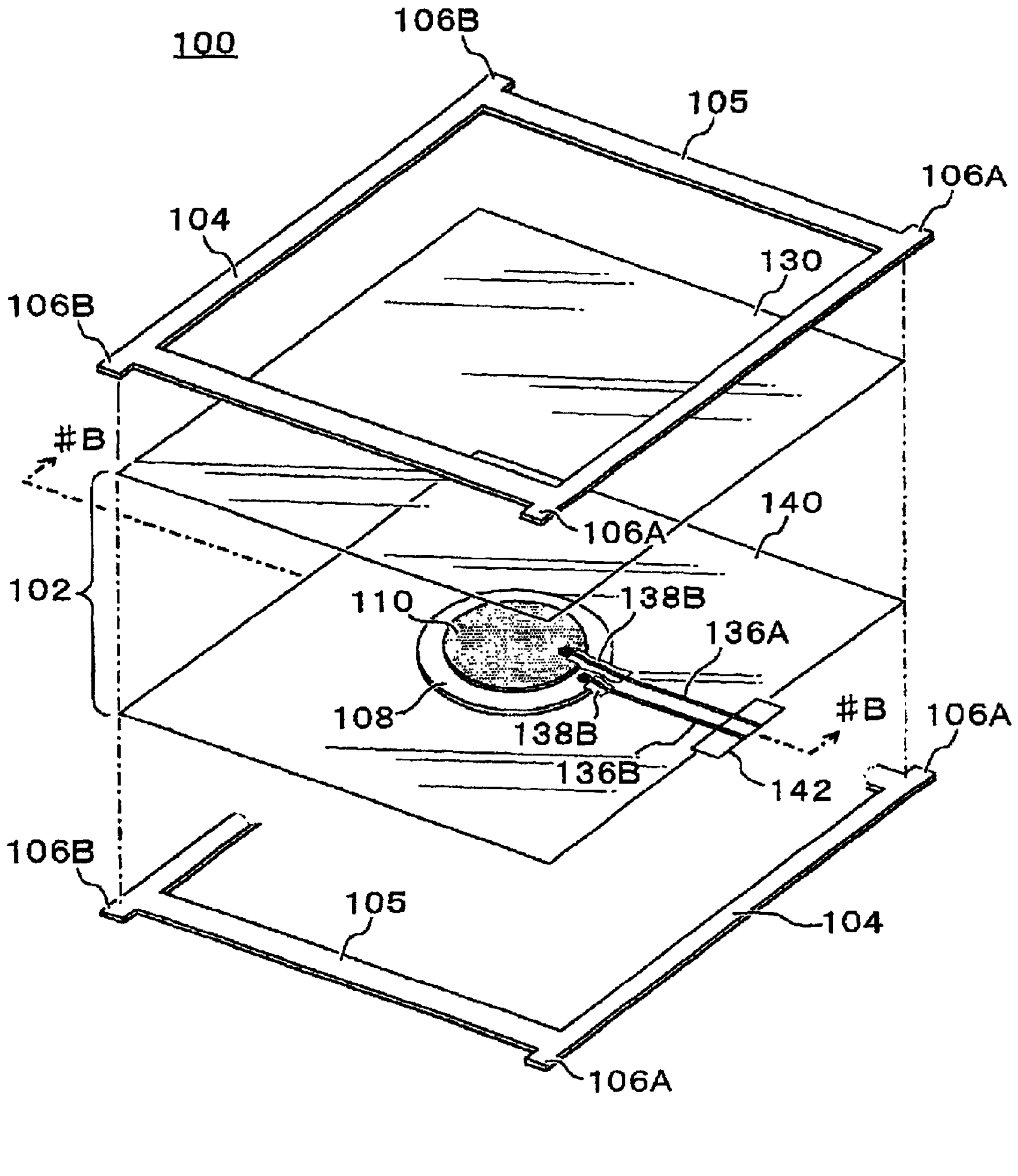
FIGS. 8A and 8B set forth an exploded view and a cross sectional view of a piezoelectric speaker in accordance with the seventh preferred embodiment of the present invention.

A seventh preferred embodiment of the present invention will now be described hereinafter with reference to FIGS. 7 to 9. FIG. 7 offers a perspective view of a notebook computer 90 having a display device 16 with speaker panels 100 in accordance with the seventh embodiment of the present invention. FIG. 8A is an exploded view illustrating the structure of one of the speaker panels 100 in FIG. 7 and FIG. 8B sets forth a cross-sectional view thereof taken along the line #B-#B of FIG. 8A. FIG. 9 describes an electrical connection structure of the speaker panels 100 and the notebook computer 90.

As shown in FIG. 7, the notebook computer 90 includes a main body 12, a keyboard 14 and the display device 16, as in the earlier-described first embodiment. The display device 16 can be folded toward or folded away from the main body 12. Prepared at two opposing side surfaces 16B of the display device 16 are reception slits 22 through which the speaker panels 100 are put into or taken out of the display device 16. The speaker panels 100 are installed in such a manner that it can move slidably along the direction marked with an arrow F1.

At a top and a bottom portion of the inside of the display device 16 are prepared rails 92 for slidably guiding the speaker panels 100. Formed at each of two opposite end portions of each of the top and bottom rails 92 is a blocking member 94 for determining the maximum extraction position and the fully accommodated position of the display device 16. Further, at the center portions of the top and bottom rails 92 are installed magnets 96 by which an upper and a lower metal frame 104 of the speaker panels 100 can be maintained at their fully accommodated positions in the display device 16.

As shown in FIG. 8A, the speaker panels 100 include a sheet-shaped piezoelectric acoustic device 102 held between the upper and the lower metal frame 104 made of, e.g., a stainless steel. As can be seen from FIGS. 7, 8A and 9, groves 105 are prepared at the upper and the lower side of each metal frame 104. That is, at four corners of each metal frame 104 are provided protruded portions 106A and 106B. By the engagement of these protruded portions 106A and 106B and the blocking members 94 prepared at the top and the bottom rail 92, the maximum sliding distance of the speaker panels 100 is determined.

When the speaker panels 100 are fully accommodated in the display device 16, the outer protruded portions 106B are engaged with the blocking members 94 prepared at the rails 92 and held at that position by the magnets 96 exerting attracting magnetic forces on the inner protruded portions 106A. The speaker panels 100 can be drawn out up to a position where the inner protruded portions 106A are brought into contact with the blocking members 94 at the rails 92. By the engagement of the inner protruded portions 106A and the blocking members 94, the speaker panels 100 can be prevented from being disassembled from the display device 16.

A semicircular cutout portion 98 is prepared around a front bottom portion of each of the reception slits 22 and a groove 107 is formed at each of the speaker panels 100, at a position corresponding to the semicircular cutout portion 98. A user of the notebook computer 90 can easily draw out the speaker panel 100 from the display device 16 by putting a nail into the groove 107 through the cutout portion 98.

Figure 8B:
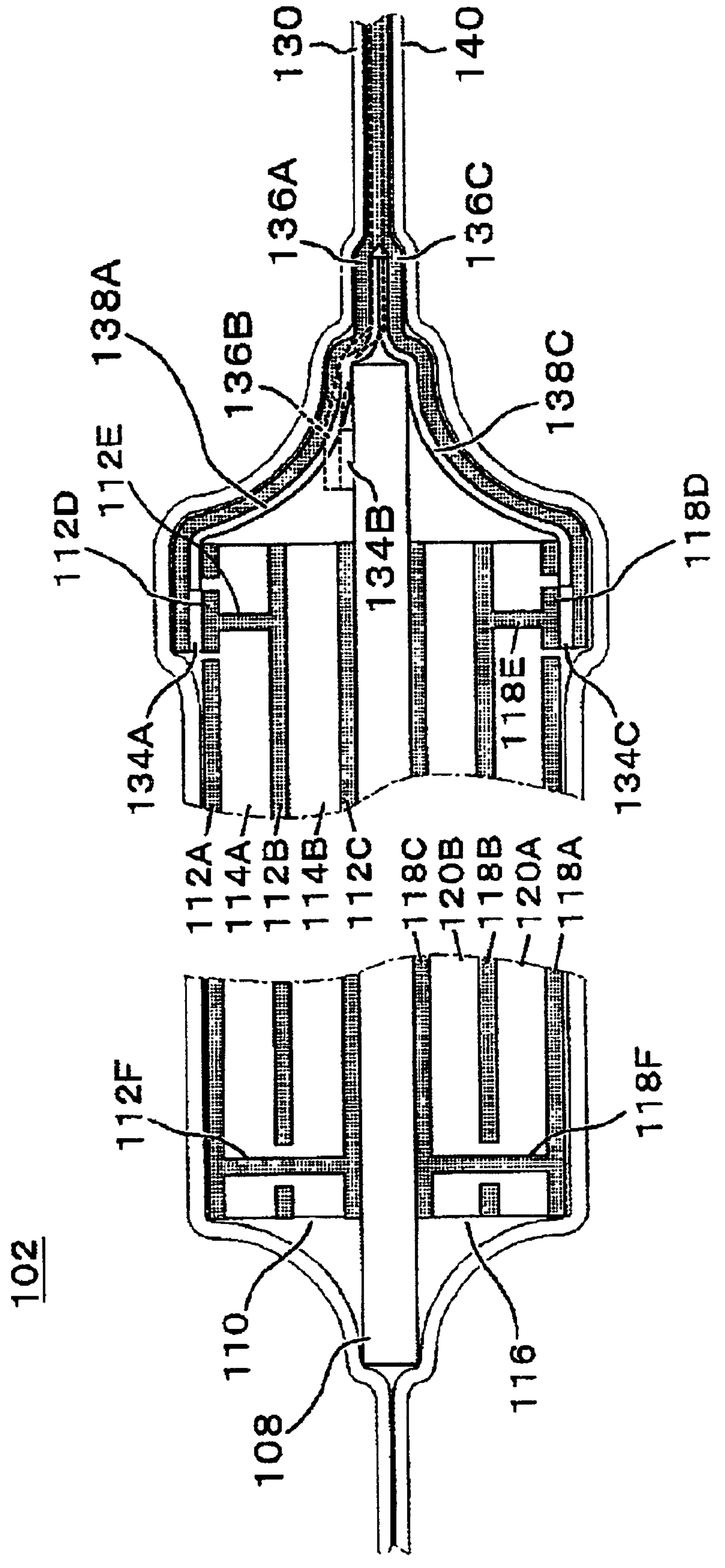
Figure 9:
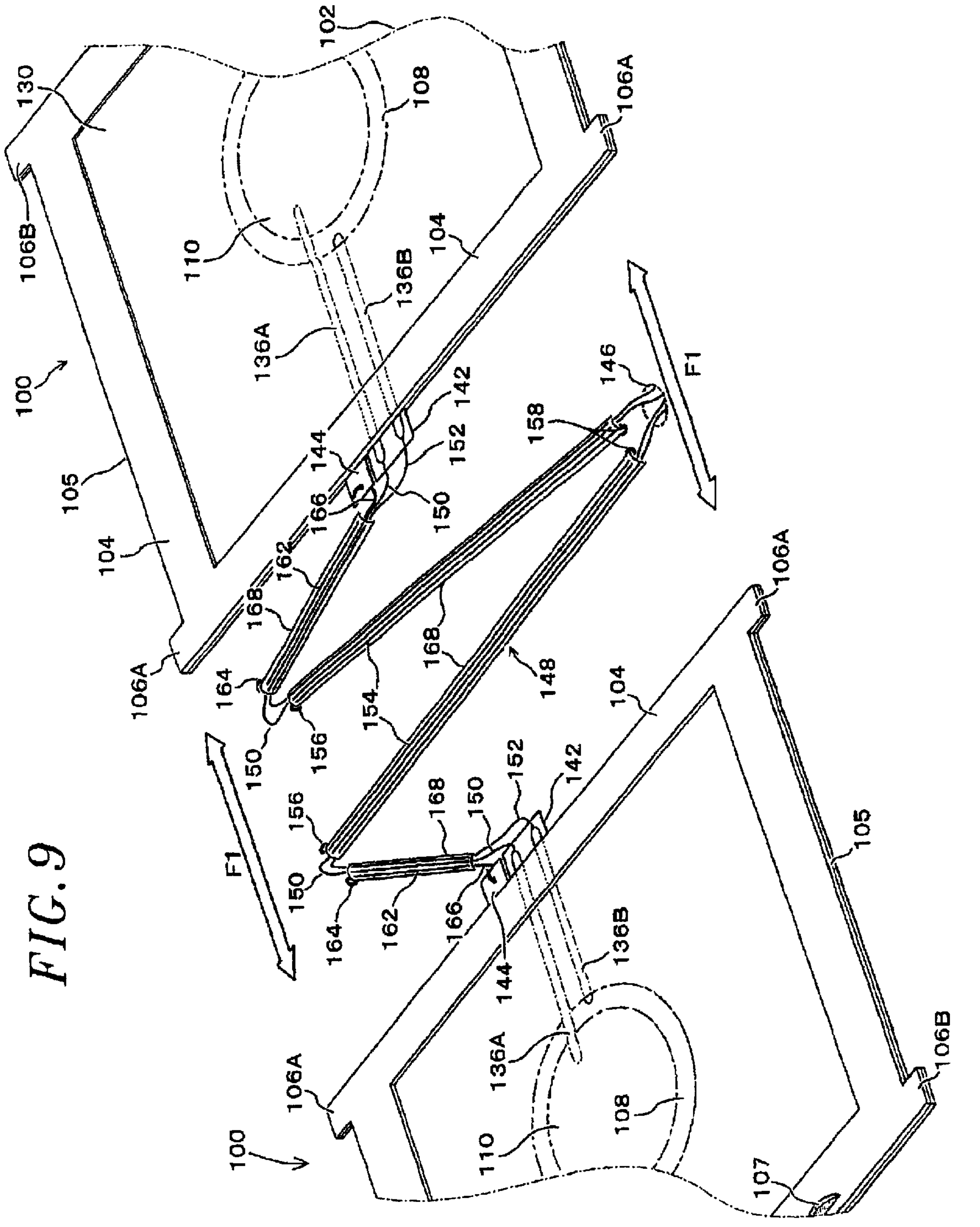
FIG. 9 shows a connecting structure of the piezoelectric speakers and a housing in accordance with the seventh preferred embodiment of the present invention.

As shown in FIG. 8B, each piezoelectric acoustic device 102 has a bimorph structure, wherein two piezoelectric elements 110 and 116 are attached by a conductive adhesive on the center portions of two opposite main sides of a disk-shaped shim plate 108 composed of, e.g., a metal. The piezoelectric elements 110 and 116 have a multi-layer structure. The assembly of the shim plate 108 and the piezoelectric elements 110 and 116 are completely covered with flexible insulating sheets or films (hereinafter referred to as flexible sheets) 130 and 140 having conductive patterns formed thereon.

The flexible sheets 130 and 140 may be formed of, e.g., a PET (polyethylene terephthalate) film and the conductive patterns may be formed of, e.g., a copper. The conductive patterns may be prepared by attaching a copper film of a predetermined shape to the flexible sheets 130 and 140 through the use of an adhesive or by screen-printing or depositing a carbon or a conductive paste directly on the flexible sheets 130 and 140.

The piezoelectric element 110 has a multi-layer structure with alternately stacked piezoelectric layers 114A and 114B and electrode layers 112A to 112C. A through hole 112E is formed through the piezoelectric layers 114A to electrically connect the electrode layer 112B to a connection island 112D. Another through hole 112F is formed through the piezoelectric layers 114A and 114B to couple the electrode layers 112A and 112C. The piezoelectric layers 114A and 114B may be formed of, e.g., a PZT (lead zirconate titanate) and the electrode layers 112A to 112C may be composed of, e.g., Ag or Ag/Pd alloy.

The piezoelectric element 116 also has a multi-layer structure with alternately stacked electrode layers 118A to 118C and piezoelectric layers 120A and 120B. A through hole 118E is formed through the piezoelectric layers 120A to electrically connect the electrode layer 118B to a connection island 118D. Another through hole 118F is formed through the piezoelectric layers 120A and 120B to couple the electrode layers 118A and 118C.

The piezoelectric acoustic device 102 having the above-described configuration is completely covered with the flexible sheets 130 and 140 having the conductive patterns prepared at predetermined positions thereon.

As shown in FIGS. 8A and 8B, the conductive patterns 136A and 136C extend from the connecting lands 112D and 118D of the piezoelectric elements 110 and 116 to the receiving portions 142 projecting beyond the outer edge of the frames 104 of the speaker panel 100. The receiving portion 142 is formed of insulating sheets. Further, the conductive pattern 136B has a length long enough to reach a proper position of the frames 104 from a proper surface position of the shim plate 108. Further, the conductive patterns 136A to 136C are respectively connected to the connecting lands 112D, the shim plate 108 and the connecting land 118D via conductive resin pads 134A to 134C. A conductive adhesive or a film coated by a conductive resin can be used as the conductive resin pads 134A to 134C.

Each of insulating sheets 138A to 138C is adhered by adhesive to parts of the conductor patterns 136A to 136C extending away from the connecting lands 112D and 118D and the shim plate 108. The insulating sheets 138A and 138C are prepared only at the necessary portions in order to block the electrical contact of the conductive patterns 136A and 136C and the shim plate 108. Accordingly, in positions that the conductive patterns 136A and 136C are not in contact with the shim plate 108, the conductive patterns 136A and 136C are in contact with each other. Further, the preparation of the insulating sheet 138B may not be necessary, since a contact between the conductive pattern 136B and the shim plate 108 does not have to be blocked.

The electrode layers 112A, 112C, 118A and 118C have same electric potential via the through holes 112F, 118F and the core plate 108 and the electrical connection therefrom is extended out via the conductive resin pad 134B and the conductive pattern 136B prepared below the flexible sheet 130. Further, the connection from the electrode layer 112B is extended out via the connecting land 112D, the conductive resin pad 134A and the conductive pattern 136A. The electrical connection from the electrode layer 118B is extended out via the connecting land 118D, the conductive resin pad 134C and the conductor pattern 136C.

Next, the speaker panels 100 described above and connecting portions 148 for providing a driving voltage from the notebook computer 90 are explained by referring to FIG. 9. As illustrated in FIG. 9, the conductive patterns 136A (and 136C) and 136B connected to the electrodes of each the piezoelectric acoustic device 102 are extended outside by the receiving portions 142 projected from sides of the frames 104. Lead wires 150 and 152 are connected to the conductive patterns 136A and 136B, respectively, wherein the corresponding lead wires 150 and 152 are connected to signal terminals (not shown) of the notebook computer 90 through a hole 146 prepared inside the display device 16.

Proximal portions of the lead wires 150 and 152 to the hole 146 and piano wires 154 are accommodated in tubes 168. Proximal portions of the lead wires 150 and 152 to the conductive patterns 136A and 136B are accommodated in tubes 168 together with the piano wires 162. Vinyl tubes having a heat-shrinkability are used as the tubes 168. The piano wires 154 and 162 and the tubes 168 are divided such that the lead wires 150 and 152 can change their running directions in the regions between the divided tubes 168. In other words, the piano wires 154 and 162 and the tubes 168 allow the load wires 154 and 162 to bend only in the regions between the tubes 168.

Further, end parts 156 and 158 of the piano wires 154 are hooked toward the outer surfaces of the tubes 168. In the same manner, ending parts 164 of the piano wires 162 are also hooked. Therefore, twisting or tangling of the lead wires 150 and 152 accompanied with the slides of the speaker panels 100 can be effectively prevented by such configuration described above.

Ending parts 166 of the piano wires 162 proximal to the frames 104 are hooked on fixing portions 144 prepared at the side parts of the frames 104. Accordingly, when the connecting portions 148 are extended, the extending force is applied not to connection parts between the lead wires 150 and 152 and the conductive patterns 136*a* and 136*b*, but to the piano wires 162.

Additionally, by setting the connection parts between the lead wires 150 and 152 and the conductive patterns 136A and 136B longer than the piano wires 162 as shown in FIG. 9, i.e., by preparing the lead wires 150 and 152 in surplus length, the force exerting on the lead wires 150 and 152 can be reduced, thereby preventing the breakage thereof. The tubes such as the tubes 168 may also be prepared to protect the lead wires 150 and 152 of the surplus length. An insulating sheet may also be prepared to protect the conductive patterns 136A and 136B exposed on the receiving portions 142.

The connection parts 148 are expanded and contracted in a similar manner as in the accordion type by providing the proper bending points on the connection parts 148 as described above. That is, as shown in FIG. 7, in case where the speaker panels 100 are accommodated into the reception slits 22, the connection parts 148 are accommodated by being folded into a gap between the speaker panels 100. In case where the speaker panels 100 are taken out, the connection parts 148 are extended. The driving voltage is applied on the electrode of the piezoelectric acoustic device 102 via the connection parts 148, the conductive patterns 136A to 136C and the conductive resin pads 134A to 134C.

Further, the speaker panels 100 can be taken out independently since the connection parts 148 are separately prepared thereto. Further, more than one bending point may be prepared for each of the connection parts 148. Also, the length between the bending points may be set properly. However, it is preferable to have the number of the bending point reduced and the length therebetween increased in order to reduce the movement of the connecting portions 148.

In accordance with the seventh preferred embodiment of the present invention, the piezoelectric acoustic device 102 including the stacked piezoelectric elements 110 and 116 are employed and the electrical connection to the electrodes thereof is made through the conductive patterns 136A to 136C formed in the piezoelectric acoustic device 102. Further, since the electrical connection between the piezoelectric element 110 and 116 and the personal computer is made via the connection parts 148 that are expanded and contracted on a plane substantially identical to that of the speaker panels 20, the whole structure can be configured to be thin and the driving voltage can be low.

(Eighth Embodiment)

Figure 10A:
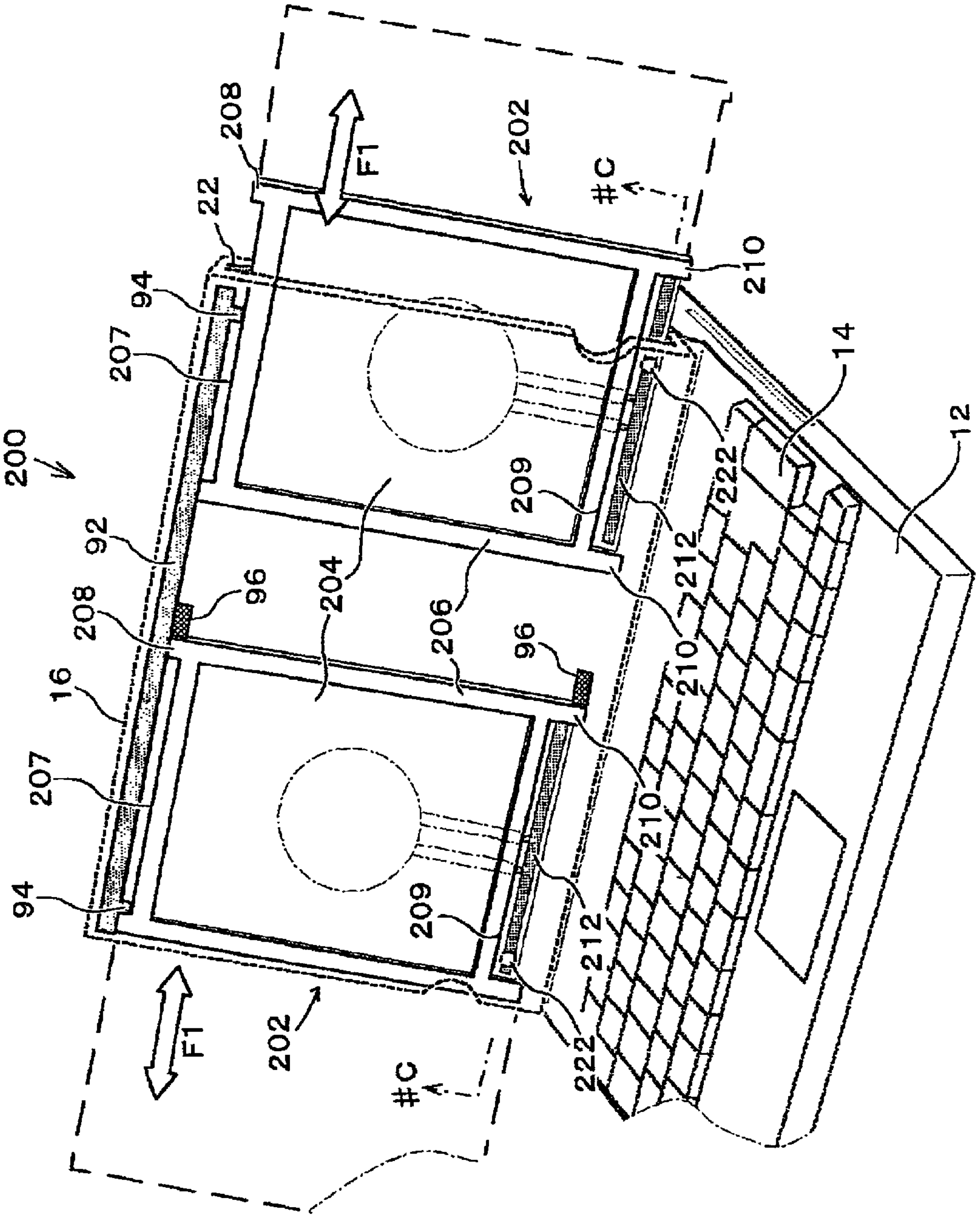
FIG. 10A presents a perspective view of an eighth preferred embodiment of the present invention.
Figure 10B:
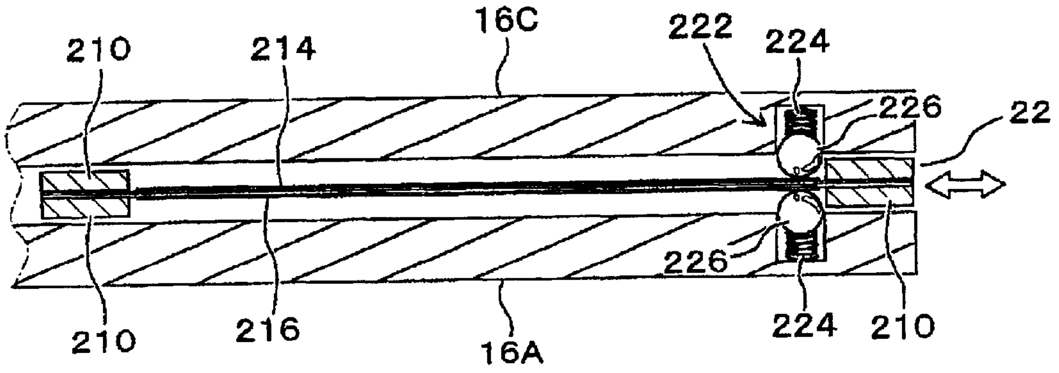
FIGS. 10B and 10C are exemplary cross sectional views taken along the line C—C shown in FIG. 10A.
Figure 10C:
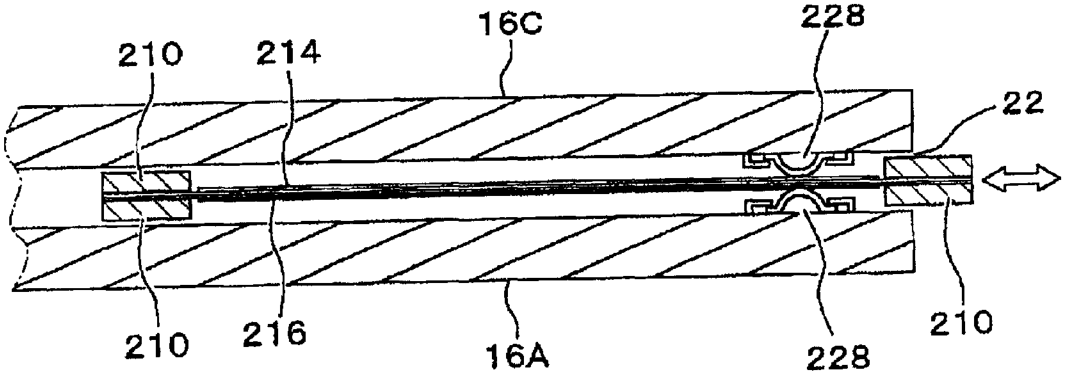
Figure 11A:
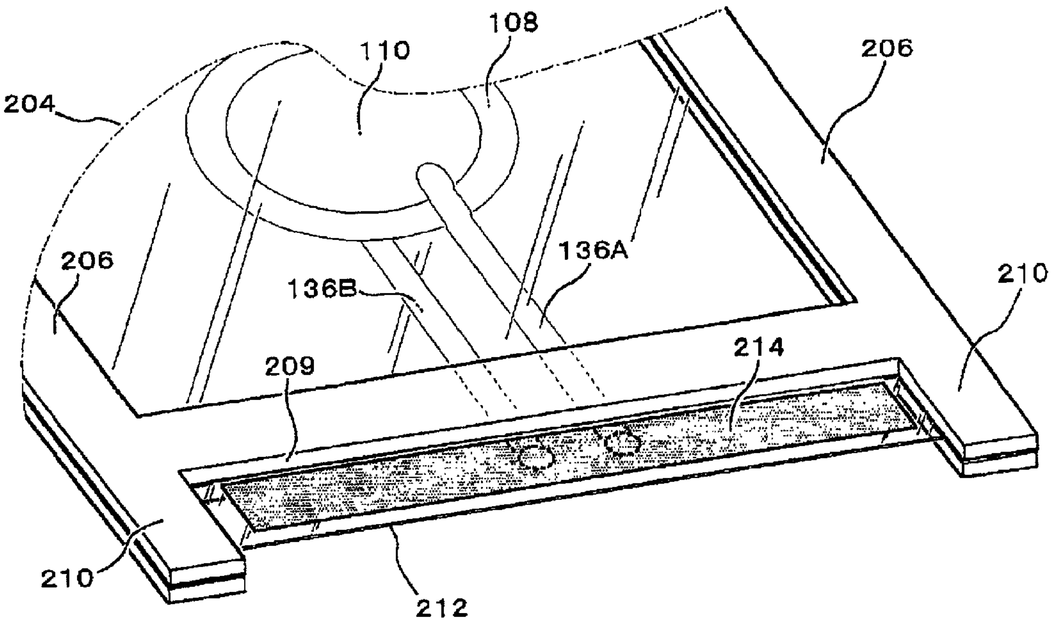
FIGS. 11A and 11B depict a perspective view of an electrode extraction structure of the piezoelectric speaker in accordance with the eighth embodiment of the present invention and an exploded view thereof, respectively.
Figure 11B:
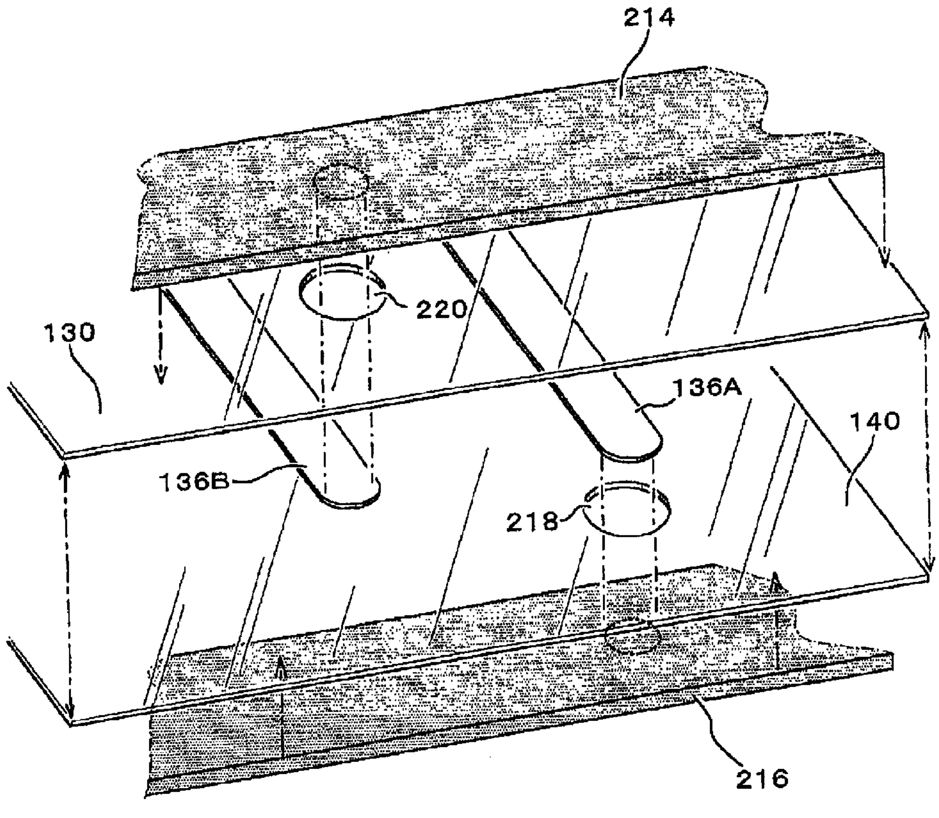

Hereinafter, an eighth preferred embodiment of the present invention will be described with reference to FIGS. 10A to 11B. The eighth preferred embodiment uses piezoelectric speakers as in the seventh and the following embodiment. FIG. 10A is a perspective view of a notebook computer 200 and FIG. 10B shows a cross sectional view taken along the line C—C. FIG. 11A depicts a structure of a speaker panel and FIG. 11B shows a partial exploded view thereof illustrating the connection part of a piezoelectric acoustic device.

As shown in FIG. 10A, the notebook computer 200 of the eighth embodiment is also configured to make speaker panels 202 be taken into and out through reception slits 22 prepared at two opposing side surfaces 16B of a display device 16 as described in the seventh embodiment. Rails 92 and magnets 96 are also prepared in the display device 16 as in the seventh embodiment. The frame structure of the speaker panels 202 is basically the same as that in the seventh embodiment, excepting for electrode extraction structure of the piezoelectric acoustic device.

In the speaker panels 202, a piezoelectric acoustic device 204 is disposed between frames 206. Grooves 207 and 209 and protruded portions 208 and 210 are formed at top and bottom portion of each frame 206, respectively. The grooves 209 at the bottom are deeper than the grooves 207 on the top, and electrode extraction parts 212 of the piezoelectric acoustic device 204 are exposed in the corresponding grooves 209.

The structure of the piezoelectric acoustic device 204 is same as that of the piezoelectric acoustic device 102 described in the seventh embodiment. The piezoelectric acoustic device 204 has piezoelectric elements 110, 116 attached to the top and bottom of a shim plate 108 and the shim plate and the piezoelectric elements assembly is completely covered with flexible sheets 130 and 140. Electrical connection to the electrodes of the piezoelectric elements 110 and 116 is provided by the conductive patterns 136A (and 136C) and 136B as in the previous embodiment. In the present embodiment, however, the conductive patterns 136A and 136B are extended up to the electrode extraction part 212. Formed at both sides of the electrode extraction part 212 are contact patterns 214 and 216 for performing an electrical contact with a contact member 222 prepared inside housing of the display device 16. In other words, the contact pattern 214 is formed on the flexible sheet 130 located in the electrode extraction part 212 and the contact pattern 216 is formed on the flexible sheet 140.

As shown in FIG. 11B, a through hole 218 is formed in a proper position of the flexible sheet 140 covering one side of the piezoelectric acoustic device 204. The conductive pattern 136A is in electrical contact with the contact pattern 216 therethrough. In the same manner, a through hole 220 is also formed on the flexible sheet 130 and the conductive pattern 136B is in electrical contact with the contact pattern 214. That is, the electrodes of the piezoelectric elements 110 and 116 are connected to the outside via the contact patterns 214 and 216. Further, the contact patterns 214 and 216 are also formed on the flexible sheets 130 and 140 in the same manner as for the conductive patterns 136A and 136C.

The speaker panels 202, as shown in FIG. 10A, can be accommodated in the display device 16. In a bottom part inside the display device 16 near the reception slits 22, contact members 222 are prepared at reception slits 22 as shown in FIG. 10B. Each of the contact members 222 includes two sets of a conductive spring 224 and a conductive ball 226 installed in the housing of the display device 16. The springs 224 are connected to signal terminals (not shown) in the notebook computer 200. Signals are provided to the piezoelectric acoustic device 204 through the balls 226 contacting to the contact patterns 214 and 216 formed at both sides of the speaker panels 202.

As described above, in the eighth preferred embodiment of the present invention, the voltage signals are provided to the electrodes of the piezoelectric acoustic device through the contact members 222 and the contact patterns 214 and 216 formed on both surfaces of the speaker panels 202. Accordingly, the electrical connection structure can be simplified without preparing any additional connecting wire. Further, the contact patterns 214 and 216 are configured in such a manner that each length of the contact patterns 214 and 216 is substantially equal to a maximum moving stroke of the speaker panel 202. Accordingly, sound can be outputted regardless of the amount of extraction of the speaker panels 202. Further, a plurality of contact members can be provided in parallel for each speaker panel 202 in order to prevent poor electrical contact.

(Ninth Embodiment)

A ninth preferred embodiment of the present invention will be described hereinafter with reference to FIGS. 12A and 12B. In the eighth preferred embodiment, sound can be produced regardless of the positions of the speaker panels. In the present embodiment, however, sound can be produced only when the speaker panel is extracted to a certain position.

Figure 12A:
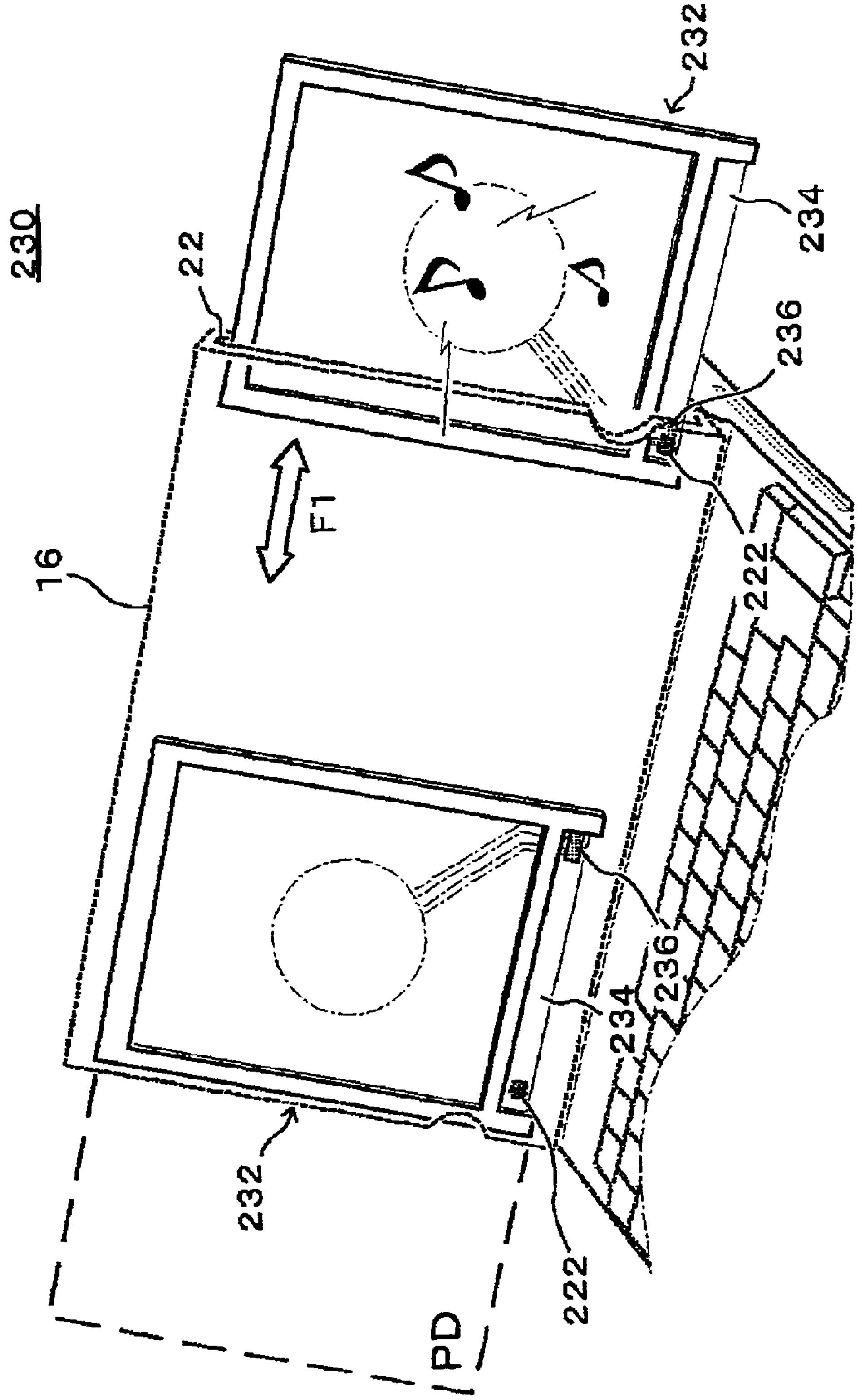
FIGS. 12A and 12B illustrate two alternative structures in accordance with a ninth preferred embodiment of the present invention.

First, a notebook computer 230 described in FIG. 12A is basically equal to that of the eighth embodiment. Contact patterns 236, however, are formed only at limited portions of electrode extraction parts 234 in this embodiment. Consequently, sound can be produced only when a speaker panel 232 is extracted out to a position, i.e., a position PD described in FIG. 12A, where a contact member 222 prepared in a display device 16 is in contact with the contact patterns 236.

Figure 12B:
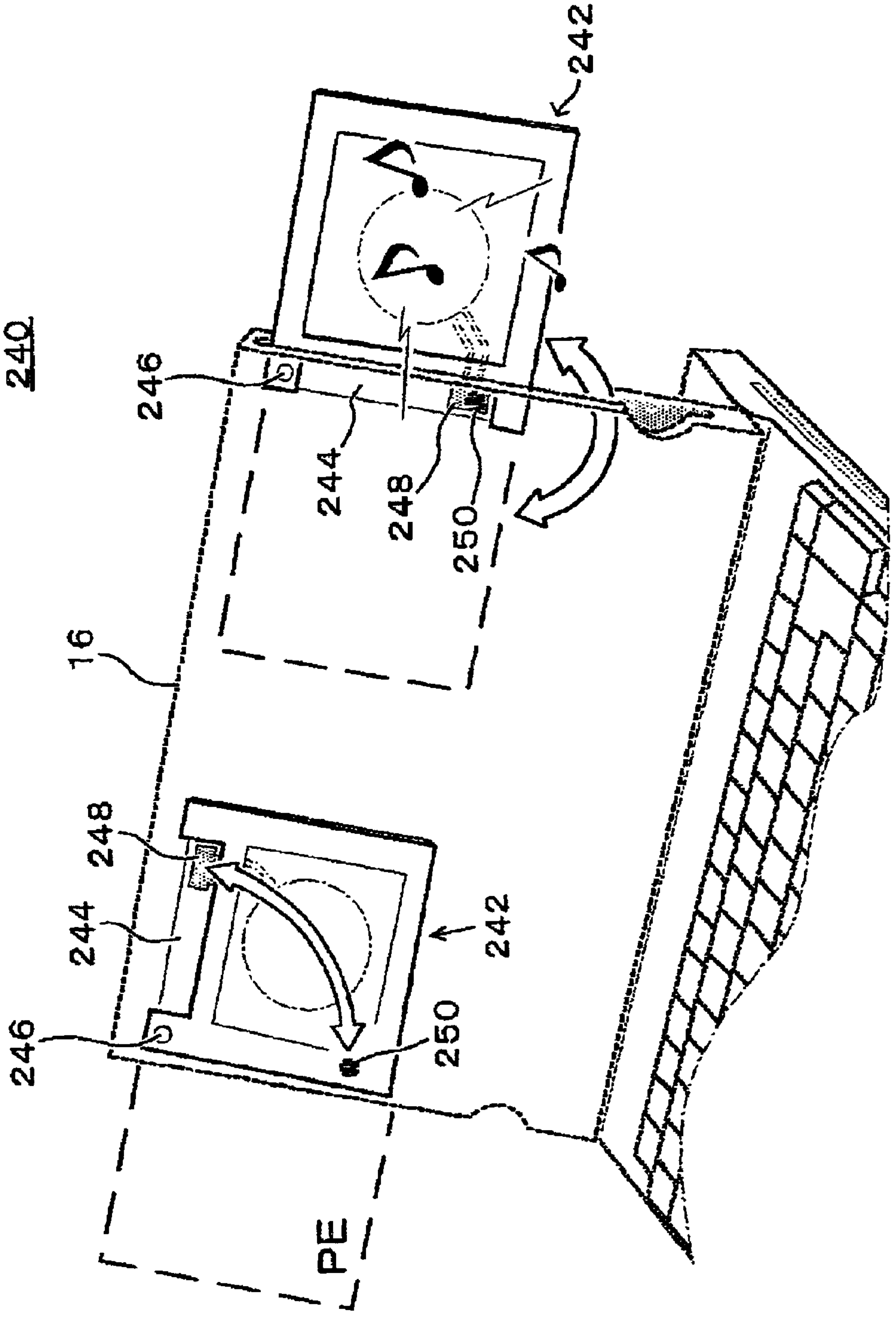
Figure 13:
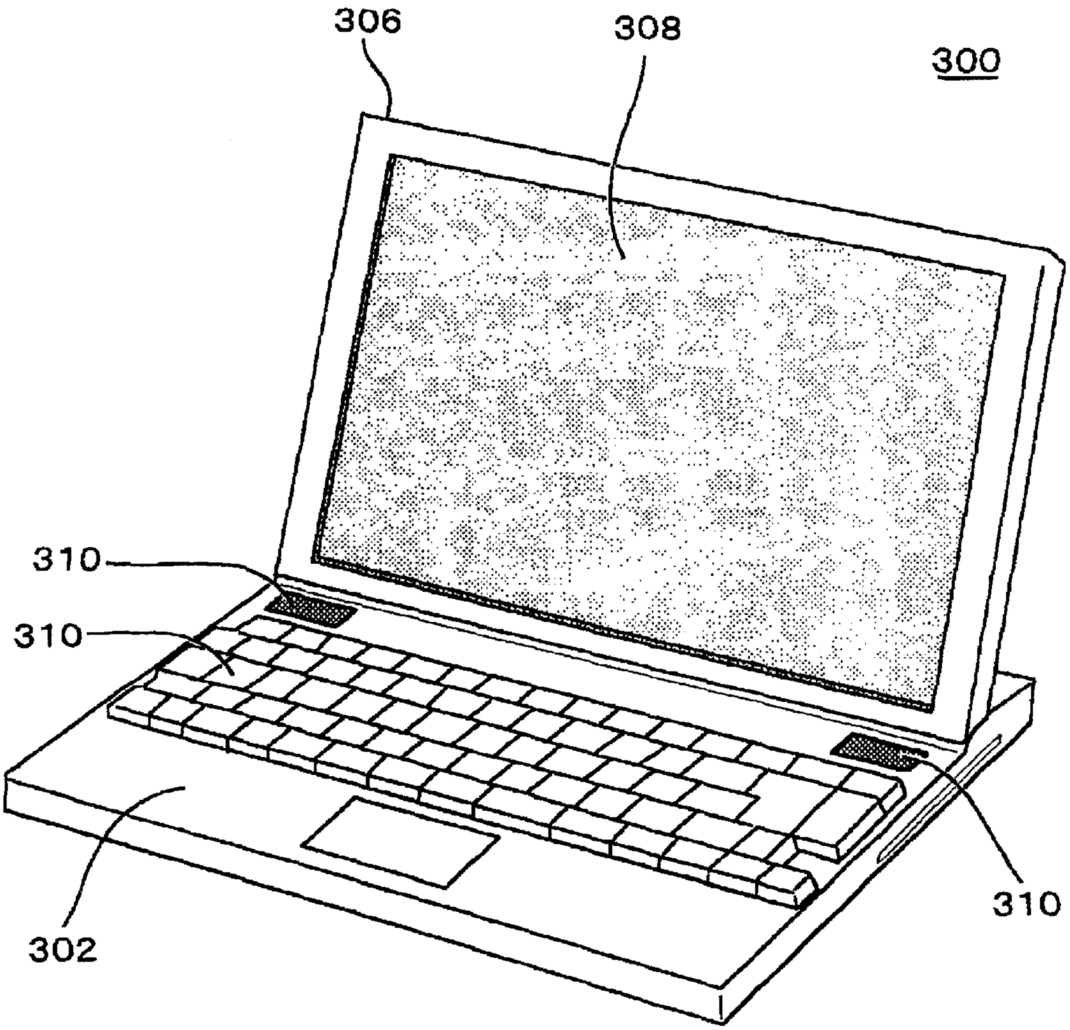
FIG. 13 (PRIOR ART)
FIG. 13 offers a perspective view of a conventional notebook computer.

FIG. 12B describes another example in accordance with the ninth preferred embodiment. A notebook computer 240 is configured in such a manner that each speaker panel 242 can be taken in or drawn out from a display device 16 through a reception slit 22 by rotating the speaker panels 242 about a pivot 246. Contact patterns 248 are formed only at limited portions of electrode extracting parts 244 of the speaker panels 242. Further, contact members 250 to be in contact with the contact patterns 248 are formed at bottom parts inside the reception slits 22. Accordingly, sound can be produced only when a speaker panel 242 is extracted out to a position PE.

In accordance with the present embodiment, the sound output can be switched on and off depending on the amount of extraction of a speaker panel by controlling positions of the contact member and positions and sizes of the contact patterns prepared in speaker panels.

It is to be appreciated that various changes and modifications of the preferred embodiments of the invention can be made, as exemplified as follows.

(1) Although the present invention has been described with respect to a notebook computer and a television set in the preferred embodiments described above, it can be also applied to such other various electronic equipments having display devices as desktop computers, DVD players.

(2) Both size and design of a notebook computer and a television set described above in the preferred embodiments can be modified if necessary.

(3) A dynamic speaker may also be used in lieu of a piezoelectric speaker described above. Further, a plurality of speakers may be prepared in one speaker panel. For example, a dynamic speaker is mounted for low frequencies and the piezoelectric speaker can be installed as a tweeter for high frequencies. The speaker may be prepared in both sides of a speaker panel and the shape thereof can be properly modified if necessary.

(4) A piezoelectric acoustic device can be of a unimorph type although the piezoelectric acoustic device has been described as a bimorph type in the preferred embodiments described above. A piezoelectric element may have a single piezoelectric layer. Both the number of piezoelectric layers and that of electrode layers can be properly modified in case of a stacked type. Further, materials, shapes and dimensions of the piezoelectric element, a connection pattern of the internal electrode and the electrode extracting structure may be properly modified while performing an identical function. Further, although the conductive patterns have been described as being connected to the electrodes via the conductive resin pads in the preferred embodiments described above, the conductive resin pads become unnecessary if the conductive patterns are electrically connected to the electrodes directly.

(5) The connecting structure between the speaker panel and the external signal terminal may be varied as well. For example, although the contact member 222 has been described to include the ball 226 and the spring 224 in the eighth preferred embodiment, a shape and a structure of the contact member 222 may be properly modified if the contact patterns 214 and 216 can be in electrical contact therewith properly. For instance, as shown in FIG. 10C, a contact member 228 having a plate spring shape may be prepared at a proper position inside the display device 16. Alternately, the planar contact member may be prepared inside the display device 16, and a protruded electrode extracting portion for contacting therewith may be prepared at a speaker panel. Further, by providing concave-convex portions formed at proper positions of both a speaker panel and a display device, an electrical connection may be made therebetween via an engagement of such prepared concave-convex portions.

(6) Although the present invention has been described with respect to two channel sound reproduction system on each side of each speaker panel, a modification can be made if required. For example, four channel system can be implemented by preparing speakers of different channels at both sides of each of the two speaker panels.

While the present invention has been shown and described with reference to the particular embodiments, it will be apparent to those skilled in the art that many changes and modifications may be made without departing from the spirit and scope of the invention defined in the appended claims.

What is claimed is:

1. An electronic equipment comprising:

a flat panel display; and a speaker panel movably jointed to the flat panel display to allow a relative position between the flat panel display and the speaker panel to be changed by moving the speaker panel, wherein the speaker panel includes a piezoelectric acoustic device having:

a piezoelectric assembly incorporating a piezoelectric element formed by stacking at least one piezoelectric layer and at least one electrode layer;

an electrode connection extracting means for connecting said at least one electrode layer to the outside of piezoelectric acoustic device; and a flexible sheet for covering the piezoelectric acoustic device and the electrode connection extracting means.

2. The electronic equipment of claim 1, wherein the piezoelectric element has a multilayer structure having alternately stacked a multiplicity of electrode layers and a number of piezoelectric layers.

3. The electronic equipment of claim 1, wherein the speaker panel is movable parallel to the flat panel display inside a housing accommodating the flat panel display.

4. The electronic equipment of claim 1, further comprising a connecting means for connecting the electrode connection extracting means to a driving means of the speaker panel, the connecting means being extended or contracted on a plane substantially identical to that of the speaker panel.

5. The electronic equipment of claim 4, wherein the connecting means is provided with means for reinforcing the connecting means and preventing the connecting means from being twisted.

6. The electronic equipment of claim 1, wherein the electrode connection extracting means is formed by a conductive pattern provided on a surface of the flexible sheet and a connecting means being in contact with the conductive pattern is positioned in a housing accommodating the flat panel display.

7. The electronic equipment of claim 6, wherein the electrode connection extracting means is in contact with the connecting means when the speaker panel is withdrawn from the housing.

8. The electronic equipment of claim 1, further comprising means for limiting a moving range of the speaker panel.

9. The electronic equipment of claim 1, further comprising means for holding the speaker panel when the speaker panel is accommodated in a housing and the flat panel display is provided in the housing.

10. An electronic equipment comprising:

a flat panel display; and a speaker panel, the flat panel display and the speaker panel being provided in a housing, wherein the flat panel display is located in a front side of the housing and the speaker panel is positioned behind the flat panel display, and wherein sound transmitting holes are provided at least at the left and the right sides of the front side of the housing.

* * * * *